(12) United States Patent
Yamamoto et al.

(10) Patent No.: US 8,120,038 B2
(45) Date of Patent: Feb. 21, 2012

(54) ELECTRONIC DEVICE AND METHOD OF MANUFACTURING THE SAME

(75) Inventors: Tetsuro Yamamoto, Kanagawa (JP); Katsuhide Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 232 days.

(21) Appl. No.: 12/498,487

(22) Filed: Jul. 7, 2009

(65) Prior Publication Data
US 2010/0006853 A1    Jan. 14, 2010

(30) Foreign Application Priority Data
Jul. 14, 2008   (JP) ................. 2008-182889

(51) Int. Cl.
H01L 29/786    (2006.01)
H01L 33/00     (2010.01)
H01L 21/20     (2006.01)

(52) U.S. Cl. .............. 257/72; 438/487; 257/E29.292; 257/E21.134

(58) Field of Classification Search ............ 257/66, 257/72, E29.292, E21.134; 438/487
See application file for complete search history.

(56) References Cited

U.S. PATENT DOCUMENTS
6,011,274 A *  1/2000  Gu et al. ................... 257/59
6,211,533 B1 * 4/2001  Byun et al. ............... 257/59

FOREIGN PATENT DOCUMENTS
| JP | 2002-175029   | 6/2002 |
| JP | 2003-091245   | 3/2003 |
| JP | 2005-18673 A  | 7/2005 |
| JP | 2006-237587 A | 9/2006 |

OTHER PUBLICATIONS
Japanese Patent Office, Office Action issued in Patent Application JP 2008-182889, on Jun. 22, 2010.

* cited by examiner

Primary Examiner — Matthew W Such
Assistant Examiner — Monica D Harrison
(74) Attorney, Agent, or Firm — SNR Denton US LLP

(57) ABSTRACT

An electronic device includes: a substrate; and a plurality of thin film transistors disposed in lines at least in one direction in terms of planar view when viewed from one principal surface of the substrate; each of the plurality of thin film transistors including a preliminary heating layer on the substrate, an insulating layer on the preliminary heating layer, and a thin film semiconductor layer a part of which overlaps the preliminary heating layer through the insulating film, wherein a portion of the preliminary heating layer other than the portion overlapping the thin film semiconductor layer has a planar shape which is line-symmetrical with respect to an axis extending in a direction perpendicularly intersecting the one direction.

8 Claims, 13 Drawing Sheets

$$I_{ds} = \frac{1}{2}\mu\frac{W}{L}C_{ox}(V_{gs}-V_{th})^2$$

— INITIAL STATE

----- AFTER TEMPORAL CHANGE

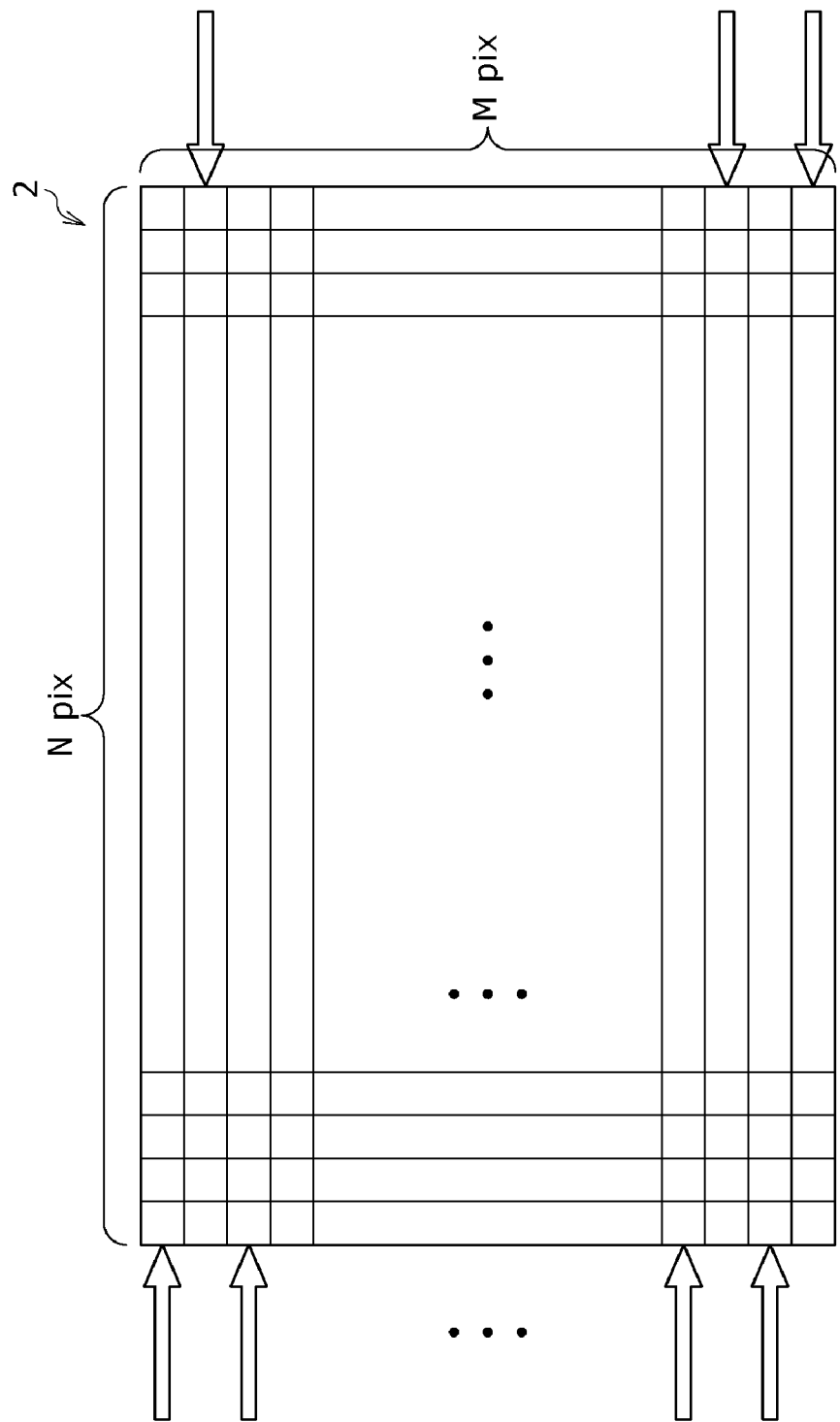

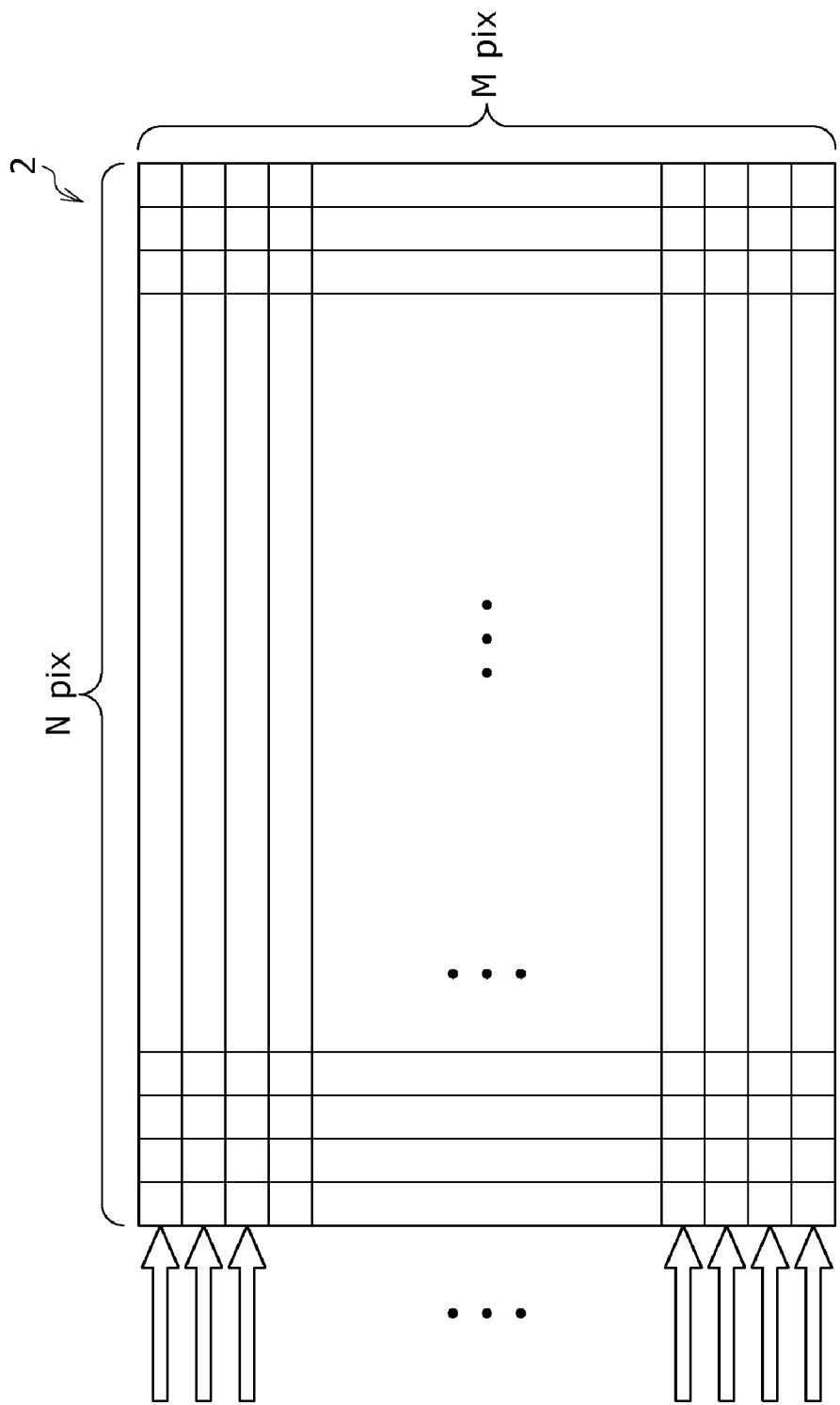

11B 11A  13d 14A  13d 11A 11B
  11              11

GATE METAL
AMORPHOUS SILICON
Al

BOUNDARY BETWEEN PIXELS

OUTWARD ROUTE →
← HOMEWARD ROUTE

OUTWARD ROUTE →
← HOMEWARD ROUTE

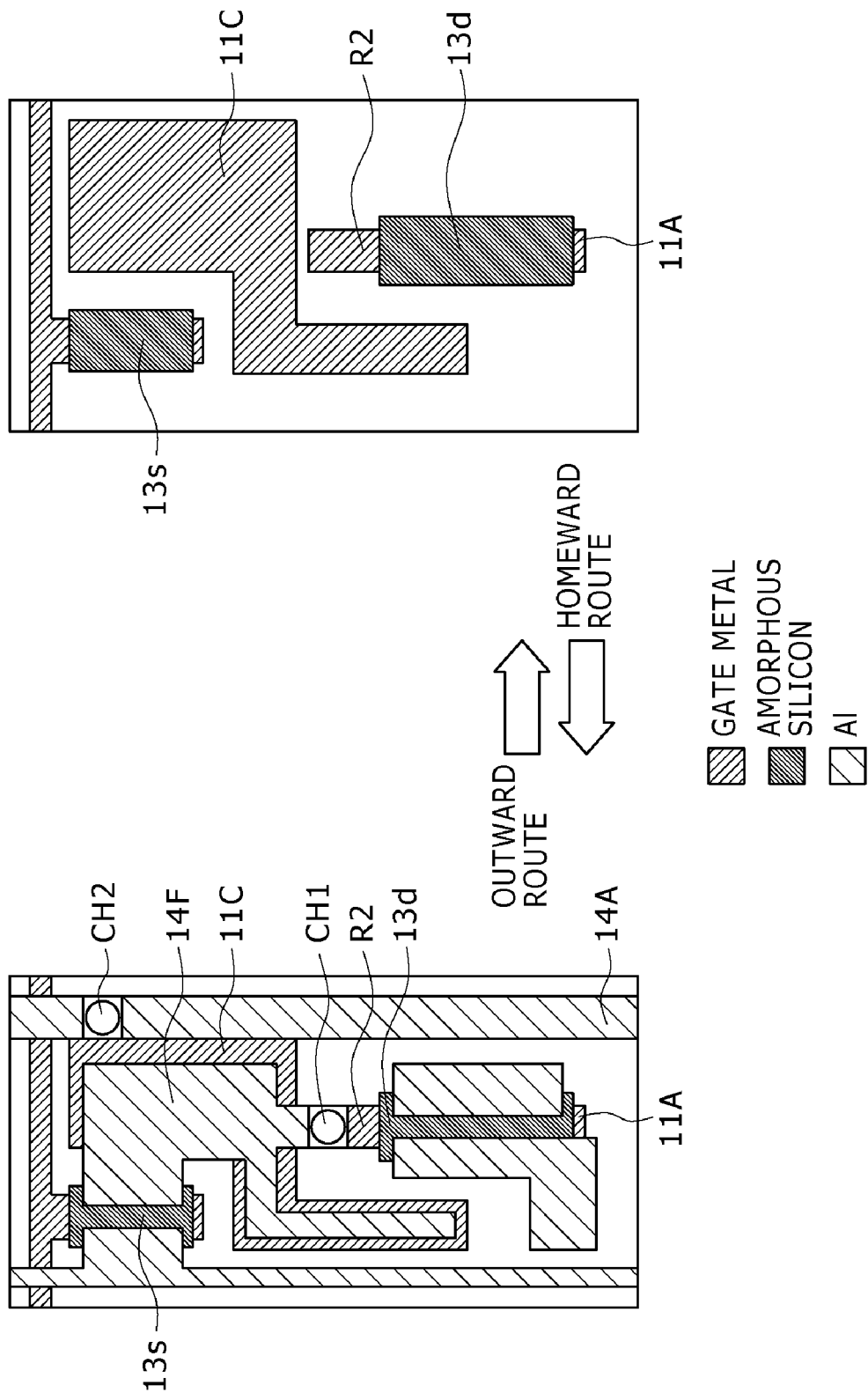

ELECTRONIC DEVICE AND METHOD OF MANUFACTURING THE SAME

BACKGROUND OF THE INVENTION

1. Field of the Invention

The present invention relates to an electronic device, such as a display device or an integrated circuit device, having a thin film transistor. Also, the present invention relates to a method of manufacturing the electronic device including the step of annealing a thin film semiconductor layer of the thin film transistor by carrying out laser beam scanning.

2. Description of the Related Art

A display device such as a liquid crystal display device or an organic EL (electroluminescence) device is known as an electronic device having a Thin Film Transistor (TFT).

The thin film transistor (hereinafter referred to as "the TFT") is used as a switching element which applies a voltage corresponding to an image signal to a liquid crystal layer in the liquid crystal display device.

In addition, the TFT is also used as a drive transistor which controls an amount of current caused to flow through a self light emitting element provided every pixel in the organic EL display device. In each of the pixels of the organic EL display device, in addition to the drive transistor, a switching element is necessary for the cutoff control of a current path, sampling for an image signal, or the like. The TFT is also used as the switching element.

The TFT has a thin film semiconductor layer made of polysilicon, amorphous silicon or the like within a lamination structure obtained by laminating thin films on a panel substrate of a display device by utilizing the same technique as that for a semiconductor integrated circuit. A source/drain region is formed in the thin film semiconductor layer, and a gate electrode is disposed so as to be close to either an upper surface or a lower surface of the thin film semiconductor layer through a gate insulating film.

In general, in a low-temperature polysilicon TFT, an Exima Laser Anneal (ELA) method is utilized in an anneal process for crystallizing amorphous silicon (a formation film of the thin film semiconductor layer) to cause amorphous silicon to turn into polycrystalline silicon (polysilicon).

However, although the low-temperature polysilicon TFT formed by utilizing the ELA method has a large mobility, threshold voltages or the mobilities of the low-temperature polysilicon TFTs largely disperse. The threshold voltages and the mobilities of the TFTs disperse, which results in that an operation for the pixel drive becomes unstable in the liquid crystal display device or organic EL display device described above.

More specifically, in the laser beam radiation utilizing the ELA method, line-like scanning is carried out in such a way that the laser beam is intermittently radiated to a region (shot region), having a predetermined shape, radiated with a laser beam in accordance with pulse drive while the region radiated with the laser beam is partially shifted in one direction. Also, the next line-like scanning is similarly carried out in such a way that a center of the shot region is shifted in a direction perpendicularly intersecting the one scanning direction so that the shot region partially overlaps the former shot region in the direction as well perpendicularly intersecting the one scanning direction. The ELA method is carried out by repetitively carrying out such line-like scanning using the laser beam.

At this time, for example, the uniformity of the TFT characteristics within the scanning line becomes superior to that of the TFT characteristics in the direction perpendicularly intersecting that scanning direction. To put it the other way around, the threshold voltages and mobilities of the TFTs are easy to disperse in the direction perpendicularly intersecting the scanning line, which causes periodic streak-like luminance nonuniformity on the display screen.

In particular, in the drive transistor of the organic EL display device, an amount of drive current for a light emitting element is adjusted in accordance with a level of a signal inputted to the pixel. As a result, the dispersion of the threshold voltages and mobilities of the TFTs directly appear in the form of a change in emission luminance of the pixel. In addition, although the sampling transistor is the switching transistor, the sampling time depends on the threshold voltage, and when the mobility differs, an amount of signal charges fetched in differs even for the same sampling time. Therefore, the emission luminance changes in any way due to the dispersion as well of the characteristics of the sampling transistors.

In order to prevent the display nonuniformity in the organic EL display due to the ELA scanning, various kinds of proposals are made. These proposals, for example, are described in Japanese Patent Laid-Open Nos. 2003-91245 and 2002-175029 (hereinafter referred to as Patent Document 1 and Patent Document 2).

In the technique described in Patent Document 1, a plurality of TFTs (drive transistors) are provided so as to be connected in parallel with light emitting elements, respectively. At this time, a direction (channel length direction) along which a channel current is caused to flow is made to differ among the plurality of TFTs. Also, the ELA laser beam radiation in one direction, or the ELA laser radiation in plural directions is carried out for the amorphous semiconductor film a crystalline property of which differs depending on the channel length directions, thereby making the periodical luminance nonuniformity due to the ELA scanning described above less noticeable on the display screen.

In Patent Document 2, a compensating transistor which has a channel conductivity type opposite to one conductivity type of a drive transistor and which is diode-connected is provided in series with the drive transistor connected to a light emitting element. When the characteristic dispersion is caused in the drive transistor due to the laser beam line-like scanning in the phase of the ELA, the opposite characteristic dispersion is caused in the compensating transistor of the opposite conductivity type so as to absorb the change in drive current due to the characteristic dispersion described above. For this reason, the periodic luminance nonuniformity due to the ELA scanning described above can be made less noticeable on the display screen.

SUMMARY OF THE INVENTION

However, the techniques described in Patent Document 1 and Patent Document 2 have a disadvantage that the pixel circuit becomes large because the pixel circuit is devised in terms of the circuit. In addition, with the device made in terms of the circuit, the effect is limited.

On the other hand, the periodic streak-like luminance nonuniformity due to the laser beam scanning becomes dramatically less prominent when a laser beam radiation energy is reduced. However, when the laser beam radiation energy is reduced, the desired TFT characteristics cannot be obtained because the crystallization does not progress. Also, the characteristic dispersion is caused in the TFTs due to another primary factor of imperfect crystallization, which results in that the display quality is reduced.

When the laser beam radiation energy is reduced, the number of times of the scanning is increased and the region radiated with the laser beam is shifted a little bit at a time so that the same pixel is radiated with the laser beam many times, thereby making it also possible to promote the crystallization. However, when the number of times of the scanning is increased, it takes a lot of time to carry out the annealing process, which becomes a primary factor of the cost increase.

The characteristic dispersion due to the laser beam anneal is similarly caused in an electronic device other than the display device, for example, an integrated circuit device or the like in which the thin film transistors are dispersed in an array.

In the light of the foregoing, it is therefore desirable to provide an electronic device having a thin film transistor formed such that when heat source scanning is carried out by using laser beam radiation or the like, the semiconductor thin film is sufficiently heated even with a low energy of the heat source, and no characteristic dispersion is caused between an outward route and a homeward route of the heat source scanning, and a method of manufacturing the same.

In order to attain the desire described above, according to an embodiment of the present invention, there is provided an electronic device including: a substrate; and a plurality of thin film transistors disposed in lines at least in one direction in terms of planar view when viewed from one principal surface of the substrate.

Each of the plurality of thin film transistors includes: a preliminary heating layer on the substrate; an insulating layer on the preliminary heating layer; and a thin film semiconductor layer a part of which overlaps the preliminary heating layer through the insulating film. In the preliminary heating layer, a portion of the preliminary heating layer other than the portion overlapping the thin film semiconductor layer has a planar shape which is line-symmetrical with respect to an axis extending in a direction perpendicularly intersecting the one direction.

In the embodiment, preferably, the preliminary heating layer has a first region overlapping the thin film semiconductor layer, and a second region other than the first region. Also, the second region has a planar shape having a line-symmetrical axis passing through a center of the first region.

In the embodiment, preferably, the preliminary heating layer is a gate electrode of the thin film transistor, and the insulating film is a gate insulating film of the thin film transistor.

According to another embodiment of the present invention, there is provided an electronic device including: a substrate; and a plurality of thin film transistors disposed in lines at least in one direction in terms of planar view when viewed from one principal surface of the substrate. Each of the plurality of thin film transistors includes: a preliminary heating layer on the substrate; an insulating layer on the preliminary heating layer; and a thin film semiconductor layer a part of which overlaps the preliminary heating layer through the insulating film. A planar shape of the preliminary heating layer when viewed from the one principal surface has at least one first region overlapping the thin film semiconductor layer, and a second region other than the first region; and a planar shape of the second region has two rotationally symmetrical portions in which when one rotationally symmetrical portion axially rotates with a rotationally symmetrical axis as a center by 180°, the one rotationally symmetrical portion overlaps the other rotationally symmetrical portion.

According to still another embodiment of the present invention, there is provided a method of manufacturing an electronic device, including the step of forming a plurality of thin film transistors disposed in lines at least in one direction in terms of planar view when viewed from one principal surface of a substrate on the substrate.

The step of forming the plurality of thin film transistors includes the steps of: forming a preliminary heating film on the substrate; patterning the preliminary heating film into a predetermined planar shape for each thin film transistor; forming an insulating film so as to cover exposed surfaces of the plurality of preliminary heating layers; forming a semiconductor thin film on the insulating film; scanning a laser beam from one side to the other side of the one direction, repeating the scanning plural times while a direction of the scanning is alternately changed within the one direction, and annealing the semiconductor thin film; and patterning the semiconductor thin film in order to form the thin film semiconductor layer for each thin film transistor.

In the step of patterning the preliminary heating film, the preliminary heating film is patterned so that the predetermined planar shape of the preliminary heating film for each thin film transistor becomes line-symmetrical with respect to an axis extending in a direction perpendicularly intersecting the one direction. In the step of patterning the semiconductor thin film, the semiconductor thin film is patterned so as to form the thin film semiconductor layers in which a planar shape of a region other than a region partially overlapping the preliminary heating layer becomes line-symmetrical with respect to the axis.

In the constitution described above, the thin film semiconductor layer is stacked on the preliminary heating layer through the insulating film. At this time, when attention is paid to the planar shape of the preliminary heating layer, the part of the preliminary heating layer overlaps the planar shape of the thin film semiconductor layer. Here, the planar shape means the shape (the shape of the pattern) in terms of the planar view when viewed from the one principal surface of the substrate on which the preliminary heating layer and the thin film semiconductor layer are formed. In terms of the planar view when viewed from the one principal surface of the substrate, a plurality of thin film transistors are formed in lines at least in the one direction. The thin film semiconductor layer is the layer in which a channel of the thin film transistor is intended to be formed.

In the preliminary heating layer partially overlapping the thin film semiconductor layer, the portion other than the overlapping portion has the planar shape which is line-symmetrical with respect to the axis extending in the direction perpendicularly intersecting the one direction (line-like disposition direction). For this reason, on the occasion of intersecting the preliminary heating layer from one side to the other side of the one direction, and on the occasion of intersecting the other side to one side of the one direction, in both the cases, the intersection is made from one pattern portion to the other pattern portion of the two pattern portions which are line-symmetrical with respect to the axis. In addition, the two pattern portions have the symmetry property for the overlapping portions between the preliminary heating layer and the thin film semiconductor layer. Therefore, if some sort of heating source intersects the preliminary heating layer, the line-symmetry property of the planar shape makes the uniformity of the heating.

More specifically, when the planar shape of the preliminary heating layer is partitioned into the first region overlapping the thin film semiconductor layer, and the second region other than the first region, the second region has the planar shape having the line-symmetrical axis passing through the center of the first region. This means that whether single first region or a plurality of first regions are provided is no object.

In addition, the planar shape of the second region has the two rotationally symmetrical portions in which when one rotationally symmetrical portion axially rotates with the rotationally symmetrical axis as the center by 180°, the one rotationally symmetrical portion overlaps the other rotationally symmetrical portion.

Here, since the first region is the portion overlapping the thin film semiconductor layer, the first region functions as a heating portion for directly heating the thin film semiconductor layer. When the preliminary heating layer is the gate electrode layer of the thin film transistor, the first region is an effective gate portion. On the other hand, the second region is the portion of the preliminary heating layer other than the first region. Thus, in general, how to heat the first region differs depending on the dispositions of the second regions.

That is to say, for example, when the phase of the scanning in the laser beam anneal is considered, the laser beam impinges on the first region, and before the first region is heated, the laser beam may impinge on the second region to be heated. In this case, the heat generated in the second region is transmitted to the first region (preliminary heating). Also, when the planar shape of the second region firstly heated in an outward route and a homeward route in the laser beam scanning is asymmetrical, the temperature of the first region differs in the preliminary heating before the main heating allowing the first region to be directly heated.

In the embodiments of the present invention, the second region having the pattern having the axial symmetry (line-symmetry) property as in the case of the embodiment, or the rotational symmetry property as in the another embodiment is connected to the first region. Therefore, when the laser beam scanning direction suitable for such a symmetry property is determined, how to heat the thin film semiconductor layer is approximately equalized between the outward route and the homeward direction of the laser beam scanning.

According to the embodiments of the present invention, it is possible to provide the electronic device having the thin film transistor formed such that when the heat source scanning is carried out by using the laser beam radiation or the like, the thin film transistor is sufficiently heated even with the low energy of the heat source, and no characteristic dispersion is caused between the outward route and the homeward route of the heat source scanning, and the method of manufacturing the same.

BRIEF DESCRIPTION OF THE DRAWINGS

FIG. 7 is a diagram showing a laser beam anneal scanning method (direction) in the organic EL display device of the embodiment shown in FIG. 3;

FIG. 8 is a diagram showing another laser beam anneal scanning method (direction) in contrast with the laser beam anneal scanning method in the organic EL display device of the embodiment shown in FIG. 3;

FIGS. 14A and 14B are respectively a top plan view of a pixel circuit in Example 2 and a top plan view of the pixel circuit in Example 2 in a phase of laser beam anneal.

DETAILED DESCRIPTION OF THE PREFERRED EMBODIMENTS

Hereinafter, an embodiment of the present invention will be described in detail with reference to the accompanying drawings. In this embodiment, the present invention is applied to an organic EL display as an electronic device.

<Entire Configuration>

Figure 1:
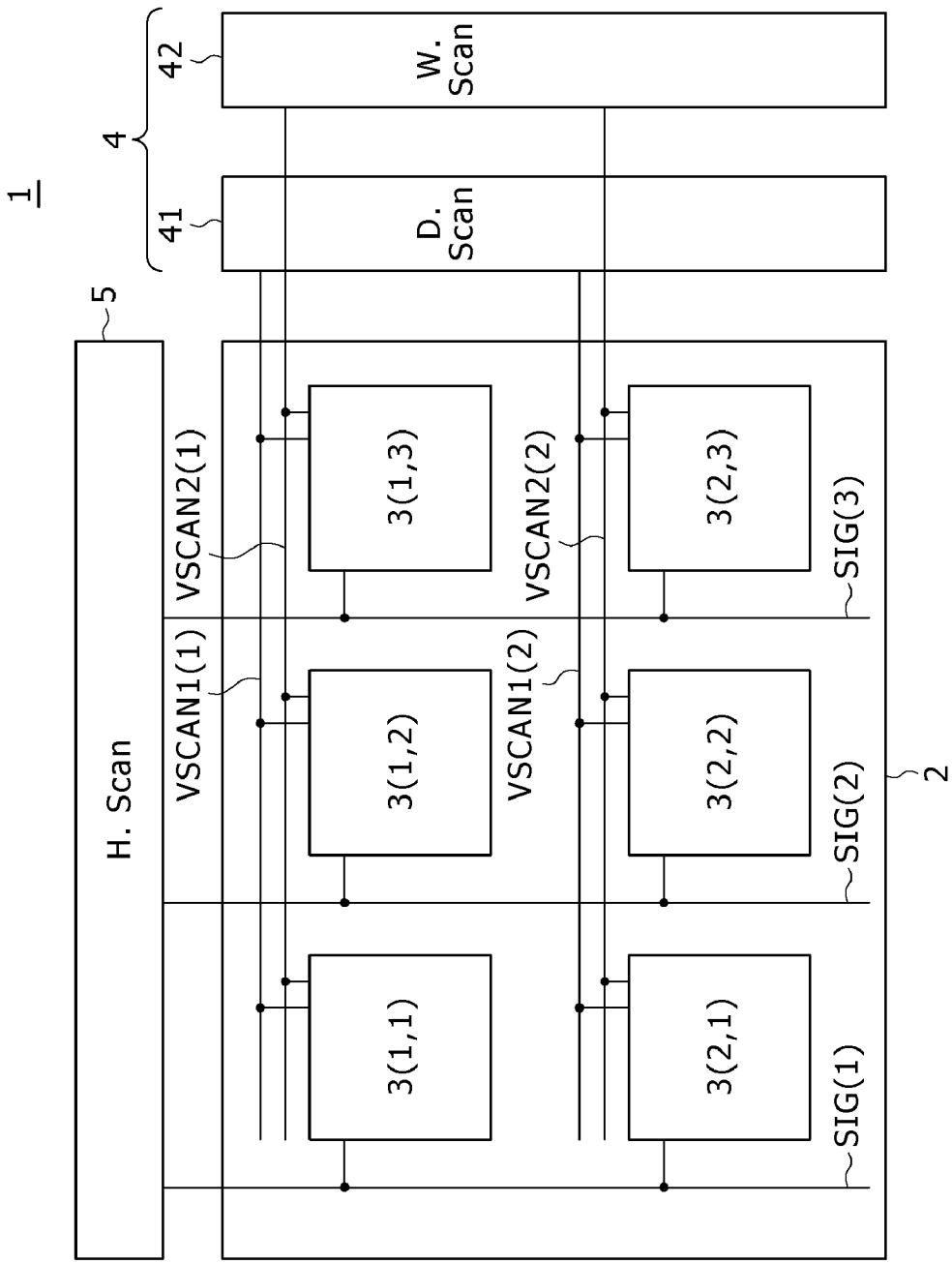
FIG. 1 is a block diagram showing a main configuration of an organic EL display device according to an embodiment of the present invention.

FIG. 1 shows a main configuration of the organic EL display device according to the embodiment of the present invention.

The organic EL display device 1 illustrated includes a pixel portion 2 having a plurality of pixel circuits (PIX.C.) 3 disposed in a matrix, and a drive circuit for driving the pixel portion 2. The drive circuit includes vertical drive circuits (V scanners) 4, and a horizontal drive circuit (H Scanner: H.Scan) 5.

A plurality of V scanners 4 are provided in accordance with a configuration of each of the pixel circuits 3. In this case, the V scanners 4 are configured so as to include a horizontal pixel line drive circuit (D.Scan) 41, and a write signal scanning circuit (W.Scan) 42.

Reference symbols "3($i, j$)" of the pixel circuit shown in FIG. 1 means that the pixel circuit concerned has an address i (i=1, 2) in a vertical direction (in a longitudinal direction), and an address j (j=1, 2, 3) in a horizontal direction (in a transverse direction). These addresses i and j take integral numbers of 1 or more which have "n" and "m" as maximum numbers thereof, respectively. Particularly in this embodiment, for the sake of simplicity of the figure, the case where n=2, and m=3 is shown.

The address representation similarly applies to elements, signals, signal lines, voltages and the like of the pixel circuits in the subsequent description and drawings.

Pixel circuits 3(1, 1) and 3(2, 1) are each connected to a common first signal lines SIG(1) in the vertical direction. Likewise, pixel circuits 3(1, 2) and 3(2, 2) are each connected to a common second signal line SIG(2) in the vertical direction, and pixel circuits 3(1, 3) and 3(2, 3) are each connected to a common second signal line SIG(3) in the vertical direction.

A first scanning signal VSCAN 1(1) can be applied from the horizontal pixel line drive circuit 41 to each of the pixel circuits 3(1, 1), 3(1, 2) and 3(1, 3) belonging to the first row through a common scanning signal line. Likewise, a first scanning signal VSCAN 1(2) can be applied from the horizontal pixel line drive circuit 41 to each of the pixel circuits 3(2, 1), 3(2, 2) and 3(2, 3) belonging to the second row through a common scanning signal line.

In addition, a second scanning signal VSCAN 2(1) can be applied from the write signal scanning circuit 42 to each of the pixel circuits 3(1, 1), 3(1, 2) and 3(1, 3) belonging to the first row through the common scanning signal line. Likewise, a second scanning signal VSCAN 2(2) can be applied from the write signal scanning circuit 42 to each of the pixel circuits 3(2, 1), 3(2, 2) and 3(2, 3) belonging to the second row through the other common scanning signal line.

<Pixel Circuit 1>

Figure 2:
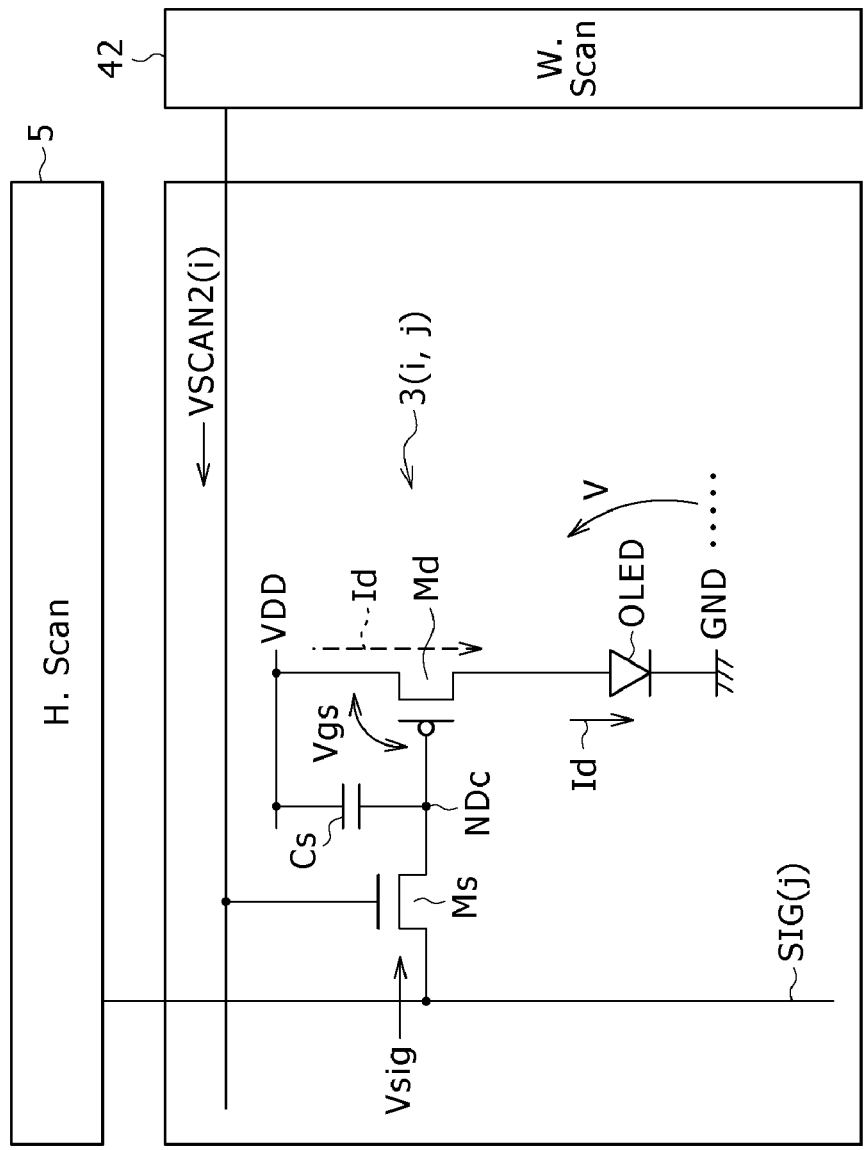
FIG. 2 is a circuit diagram, partly in block, showing a configuration of a pixel circuit having a P-channel drive transistor in the organic EL display device of the embodiment shown in FIG. 1.

FIG. 2 shows the most basic configuration of the pixel circuit 3(i, j) when a drive transistor is composed of a PMOS transistor.

The pixel circuit 3(i, j) illustrated is a circuit for controlling an organic light emitting diode OLED as a light emitting element. The pixel circuit 3(i, j) includes a drive transistor Md composed of a PMOS type TFT, a sampling transistor Ms composed of an NMOS type TFT, and one storage capacitor Cs in addition to the organic light emitting diode OLED.

Although not especially illustrated, the organic light emitting diode OLED has a structure in which a lamination body composing an organic film is formed by depositing a first electrode (anode electrode), a hole transport layer, a light emitting layer, an electron transport layer, an electron injection layer, and the like in order on a substrate made of a transparent glass or the like and a second electrode (cathode electrode) is formed on the lamination body. The anode electrode is connected to a positive side first power source, and the cathode electrode is connected to a negative side second power source. Note that, a configuration may also be adopted such that the second power source corresponds to the positive side, and the first power source corresponds to the negative side. In this case, the anode electrode is connected to the second power source, and the cathode electrode is connected to the first power source.

Note that, FIG. 2 shows the case where the anode electrode of the organic light emitting diode OLED receives a power source voltage VDD from the positive side first power source, and the cathode electrode of the organic light emitting diode OLED is connected to a reference voltage, for example, a grounding voltage GND.

When a predetermined bias voltage is applied across the anode electrode and cathode electrode of the organic light emitting diode OLED, an electron and a hole implemented into the light emitting layer are recombined with each other, thereby self-emitting a light. The organic EL light emitting diode OLED can emit a light of red (R), green (G) or blue (B) by suitably selecting an organic material of which the organic film is made. Therefore, these organic materials, for example, are disposed in each of the pixels belonging to the respective rows so as to allow the lights of R, G and B to be emitted, thereby making it possible to carry out the color display. Alternatively, R, G and B may be distinguished from one another through the colors of a filter by using an organic material for emitting a white color light. Or, the four color structure having white (W) in addition to R, G and B may also be adopted.

The drive transistor Md functions as a current control section for regulating a display gradation by controlling an amount of current caused to flow through the light emitting element (the organic light emitting diode OLED).

A source electrode of the drive transistor Md is connected to a supply line for the power source voltage VDD, and a drain electrode thereof is connected to the anode electrode of the organic light emitting diode OLED.

The sampling transistor Ms is connected between a supply line (a signal line SIG(j)) for a data voltage Vsig in accordance with which the pixel gradation is determined, and a gate electrode of the drive transistor Md. One of a source electrode and a drain electrode of the sampling transistor Ms is connected to a gate electrode of the drive transistor Md, and the other of the source electrode and the drain electrode of the sampling transistor Ms is connected to the signal line SIG(j). The data voltage Vsig is applied from the H scanner 5 to the signal line SIG(j). The sampling transistor Ms samples data having a level and corresponding to an image which is to be displayed by the pixel circuit at a suitable timing for a time period for which the data potential is applied. The reason for this is because there is excluded an influence exerted on the displayed image by a transient time period for which the level is unstable in either a leading portion or a trailing portion of the data pulse having the desired data voltage Vsig to be sampled.

The storage capacitor Cs is connected between the supply line for the power source voltage VDD and the gate electrode of the drive transistor Md. A part which is played by the storage capacitor Cs will be described later in paragraphs of "Light Emission Control operation" and "Correcting operation."

It is noted that a configuration controlled by the write signal scanning circuit 42 shown in FIG. 1 is omitted in FIG. 2. For example, another transistor connected between the supply line for the power source voltage VDD and the drive transistor Md shown in FIG. 2 may be used in this configuration. Alternatively, there may also be adopted a configuration with which it is repeated with a given period to apply the power source voltage VDD only for a predetermined time period. Although any of these configurations is provided for the drive scanning, since there are various systems in the drive scanning, any of these configurations is omitted in FIG. 2.

<Pixel Circuit 2>

Figure 3:
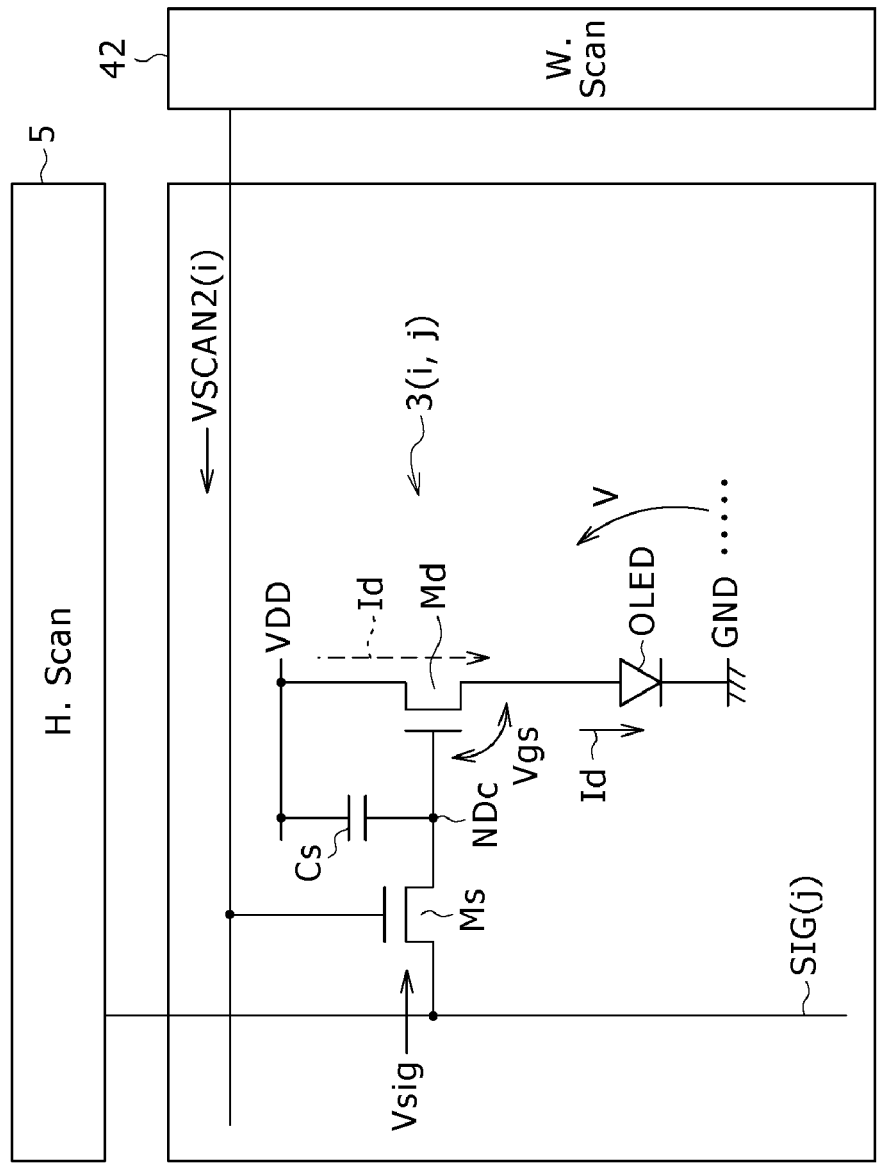
FIG. 3 is a circuit diagram, partly in block, showing a configuration of the pixel circuit having an N-channel drive transistor in the organic EL display device of the embodiment shown in FIG. 1.

FIG. 3 shows the most basic configuration of the pixel circuit 3(i, j) when the drive transistor is composed of an NMOS transistor.

The pixel circuit 3(i, j) has the same configuration as that of the pixel circuit 3(i, j) shown in FIG. 2 except that a channel conductivity type of the drive transistor Md is different from that of the drive transistor Md shown in FIG. 2. When the drive transistor Md is composed of an NMOS transistor, there are advantages that the large drive current can be obtained per unit size, and the manufacture process can be simplified because all the transistors within the pixel circuit can be configured so as to be of an N-channel type.

<Light Emission Control Operation>

A schematic light emission control operation in the two pixel circuits 3(i, j) described above will be described as follows.

One terminal of the storage capacitor Cs is connected to a light emission control node NDc of the drive transistor Md. The signal voltage Vsig sent from the signal line SIG(j) is sampled by the sampling transistor Ms, and the resulting data voltage Vsig is applied to the light emission control node NDc.

Figure 4:
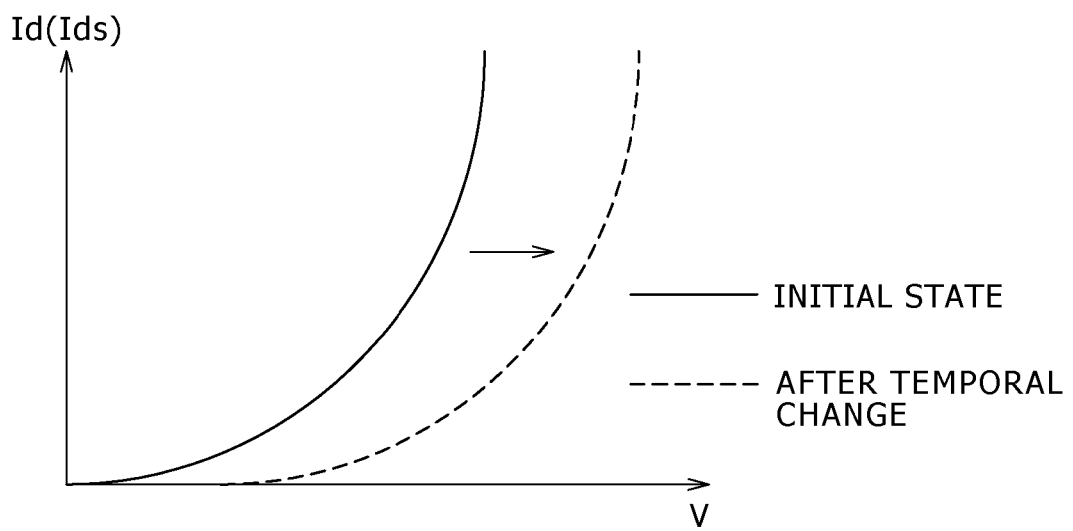
FIG. 4 is a graph of I-V characteristics of an organic light emitting diode.

FIG. 4 shows a graph of I-V characteristics of the organic light emitting diode OLED. In this case, a drain current Ids (corresponding to the drive current Id for the organic light emitting diode OLED) of the drive transistor Md is expressed by Expression (1):

$$Ids = \frac{1}{2}\mu \frac{W}{L} Cox(Vgs - Vth)^2 \qquad (1)$$

where $\mu$ is an effective mobility, W is a channel width, L is a channel length, Cox is given by (relative permittivity of gate insulating layer)×(permittivity of vacuum)/(thickness of gate insulating layer), Vgs is a gate-to-source voltage, and Vth is a threshold voltage.

When the predetermined data voltage Vsig is applied to the gate electrode of the drive transistor Md, in the case of <the pixel circuit 1: FIG. 2>, the source electrode of the P-channel drive transistor Md is connected to the power source, and thus the P-channel drive transistor Md is designed so as to usually operate in a saturated region. For this reason, the P-channel drive transistor Md serves as a constant current source having the drain current Ids given by Expression (1). The drain current Ids caused to flow by the constant current source depends on the gate-to-source voltage Vgs having a value corresponding to the data voltage Vsig applied to the gate electrode of the P-channel drive transistor Md. Therefore, the organic light emitting diode OLED emits a light with a luminance corresponding to the data voltage Vsig obtained in the sampling.

The I-V characteristics of the organic light emitting diode OLED, as well known, change as shown in FIG. 4 due to the heat. At this time, since the constant current source causes itself to flow a constant current, the applied voltage V to the organic light emitting diode OLED becomes large, and thus a drain potential of the P-channel drive transistor Md rises. However, since the gate-to-source voltage Vgs of the P-channel drive transistor Md is held constant, a constant amount of drive current Ids is caused to flow through the organic light emitting diode OLED, and thus no emission luminance changes.

However, in the case of <the pixel circuit 2: FIG. 3> having the N-channel drive transistor Md with which the P-channel drive transistor Md shown in FIG. 2 is replaced, since the source electrode of the N-channel drive transistor Md is connected to the anode electrode of the organic light emitting diode OLED, the gate-to-source voltage Vgs changes with the temporal change in characteristics of the organic light emitting diode OLED.

As a result, the drive current Id caused to flow through the organic light emitting diode OLED changes, so that the emission luminance changes even with the predetermined data voltage Vsig.

In addition, the threshold voltages Vth and the mobilities p of the drive transistors Md are each different among the pixel circuits. Therefore, the drain currents Ids disperse in accordance with Expression (1), and the emission luminance of the pixels to which the same data voltage Vsig is applied changes.

The pixel circuit having the N-channel drive transistor Md has advantages that the drive capability is high and the manufacture process can be simplified. However, for the purpose of suppressing the dispersions of the threshold voltages Vth and the mobilities p, the following correcting operation needs to be carried out prior to the light emission control operation described above.

<Correcting Operation>

Although the concrete details of the control are omitted here, a gate potential of the drive transistor Md is held at the level of the threshold voltage Vth prior to the sampling by the storage capacitor Cs. This preliminary operation is referred to as "the threshold correction."

After completion of the threshold voltage correction, the data voltage Vdata obtained in the sampling is applied to the gate electrode of the drive transistor Md, and thus the gate potential of the drive transistor Md is held at "Vth+Vdata." The drive transistor Md is turned ON in accordance with the magnitude of the data voltage Vdata at this time. In the case of the drive transistor Md which is hardly turned ON because of its large threshold voltage Vth, the value of "Vth+Vdata" is also large. Conversely, in the case of the drive transistor Md which is readily turned ON because of its small threshold voltage Vth, the value of "Vth+Vdata" is also small. Therefore, an influence of the dispersion of the threshold voltage Vth is excluded from the drive current Id. As a result, when the data voltage Vdata is held constant, the drain current Ids (the drive current Id) is also held constant.

In addition, "the mobility correction (strictly, the drive force correction)" is carried out before the data sampling and after the threshold voltage correction.

In the mobility correction, the potential change corresponding to the current drive capability of the drive transistor Md is further made from the state in which the voltage of "Vth+Vsig" is held. Although an illustration is omitted in FIGS. 2 and 3, a path through which a hold capacitor is charged or discharged based on the current caused to flow through the current channel of the drive transistor Md is provided between the gate electrode, and the source electrode or the drain electrode of the drive transistor Md. Also, the mobility correction is carried out by controlling whether or not the current is caused to flow through the path.

After that, the organic light emitting diode OLED is driven by the current having the constant value to emit a light.

The dispersion of the threshold voltages Vth and the mobilities $\mu$ of the drive transistors Md are corrected in such a manner by the circuit. However, this correcting operation is one made for the drive transistor Md. For this reason, it is most desirable to cause the threshold voltages Vth and the mobilities p to hardly disperse for all the transistors (TFTs) within the pixel circuit.

The dispersion of compositions, concentrations and the like of the TFT thin films (thin film semiconductor layers) occupy a large primary factor for the dispersion of the threshold voltages and the mobilities. With regard to a primary factor exerting an influence on the dispersion of the threshold voltages and the mobilities, as will be described below, there is one resulting from laser beam scanning in a phase of laser beam anneal for activating an introduced impurity.

<Pattern Resulting in Nonuniform Heating>

The embodiment relates to a pattern resulting in uniform heating in the laser anneal radiation in an outward route and a homeward route.

As a premise when a relationship between the heating and the pattern is made clear, firstly, a description will be given with respect to a pixel structure before changing to the pattern concerned.

Figure 5A:
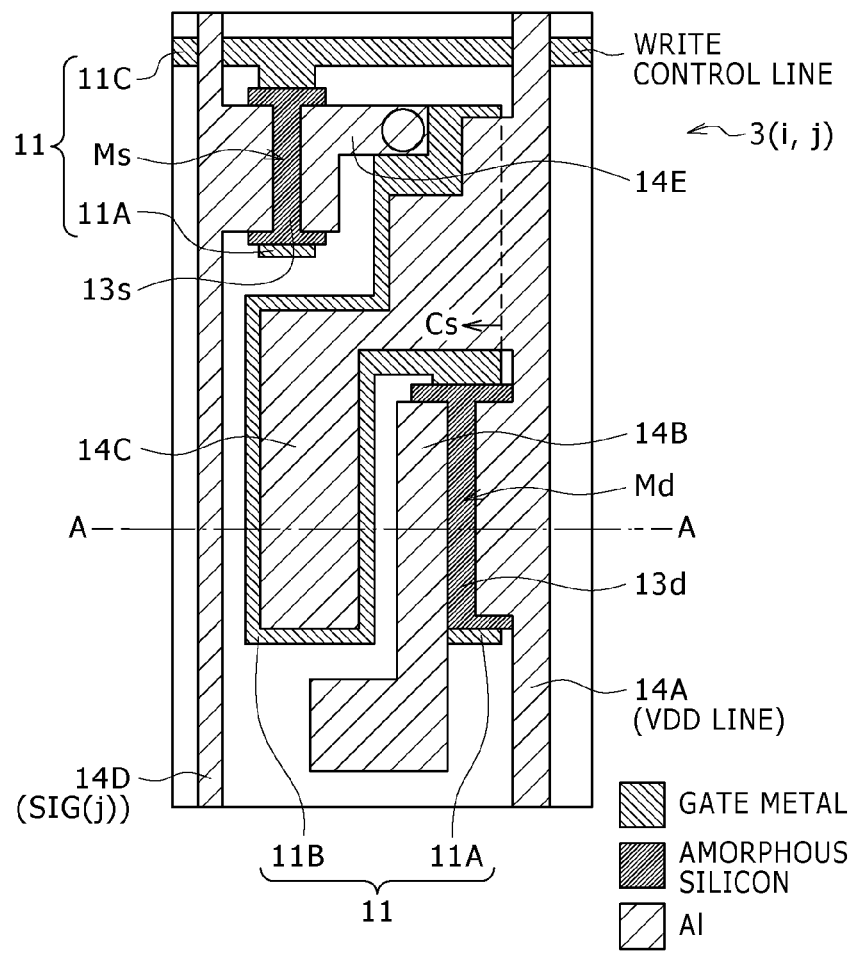
FIGS. 5A and 5B are respectively a top plan view showing a structure of the pixel circuit before a pattern is changed in the organic EL display device of the embodiment shown in FIG. 1, and a cross sectional view taken on line A-A of FIG. 5A.

FIG. 5A is a top plan view showing a structure of a pixel circuit before pattern changing is made in the embodiment. Also, FIG. 5B is a cross sectional view taken on line A-A of FIG. 5A.

Hereinafter, the word "pattern" will be used as the word meaning either one of or both of a shape (planar shape) in terms of planar view when viewed from one principal surface of a substrate as shown in FIG. 5A, and a portion having the planar shape.

Figure 5B:
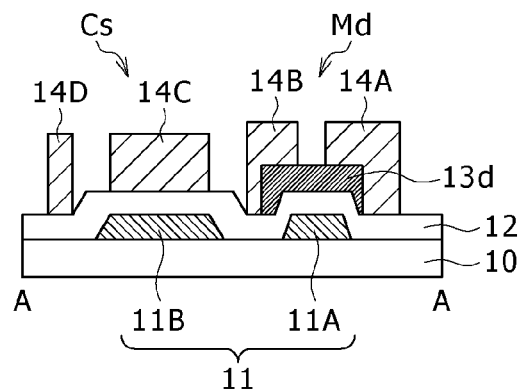

Referring to FIG. 5B, a gate electrode 11 which is made of a predetermined gate metal material, for example, molybdenum or the like, and which serves as "a preliminary heating layer" as well is formed on a substrate 10 made of a glass or the like. A gate insulating film 12, as "an insulating film," made of a silicon oxide or the like is formed on the gate electrode 11 so as to cover an exposed surface of the gate electrode 11. A thin film semiconductor layer (amorphous silicon layer) 13d of the drive transistor Md is formed in a position where the thin film semiconductor layer 13d overlaps a part (gate finger portion) 11A, of the gate electrode 11, mainly becoming an effective gate portion, and on the gate insulating film 12.

This structure also applies to a thin film semiconductor layer 13s for the sampling transistor Ms (refer to FIG. 5A).

However, a length of the gate finger portion 11A is different between the drive transistor Md and the sampling transistor Ms. In addition, the other gate electrode portion which continues so as to be formed integrally with the gate finger portion 11A is different between the drive transistor Md and the sampling transistor Ms.

Specifically, in the drive transistor Md, a lower electrode, of the storage capacitor Cs, having a large area is formed from a base of the gate finger portion 11A, and a part 11B of the gate electrode 11 extends in parallel with the gate finger portion 11A.

On the other hand, in the sampling transistor Ms, a supply line (represented by "WRITE CONTROL LINE" in the figure), for the second scanning signal VSCAN 2(i), which is wired horizontally (transversely) is coupled to the base of the gate finger portion 11A.

Referring back to FIG. 5B, various wirings and connections into which, for example, an aluminum (Al) film is patterned to be formed are provided on the thin film semiconductor layer 13d.

In FIG. 5B, a VDD line 14A, a connection wiring 14B, an upper electrode 14C of the storage capacitor Cs, and a SIG line 14D as the signal line SIG(j) are formed in this order from the right-hand side. In this case, the VDD line 14A is electrically connected to one of the source electrode and the drain electrode of the thin film semiconductor layer 13d, and serves as a supply line for the power source voltage VDD. Also, the connection wiring 14B is electrically connected to the other of the source electrode and the drain electrode of the thin film semiconductor layer 13d. Here, the other of the source electrode and the drain electrode of the thin film semiconductor layer 13d is connected to the organic laminated layer of the organic light emitting diode OLED (not shown) through the connection wiring 14B because the organic laminated layer of the organic light emitting diode OLED is disposed in an upper layer.

It is noted that the SIG line 14D is connected to the thin film semiconductor layer 13s of the sampling transistor Ms, and other connection wiring 14E is connected to the thin film semiconductor layer 13s. In this case, the other connection wiring 14E is formed concurrently with the SIG line 14D by patterning a film made of Al or the like. The connection wiring 14E is connected to the part 11B (the lower electrode of the storage capacitor Cs) of the gate electrode 11 in the lower layer.

<Relationship between Laser Beam Anneal and Pattern>

In this paragraph, firstly, laser beam anneal will be described, and secondly, the reason that the heating becomes nonuniform depending on the gate electrode patterns will be made clear.

Figure 6A:
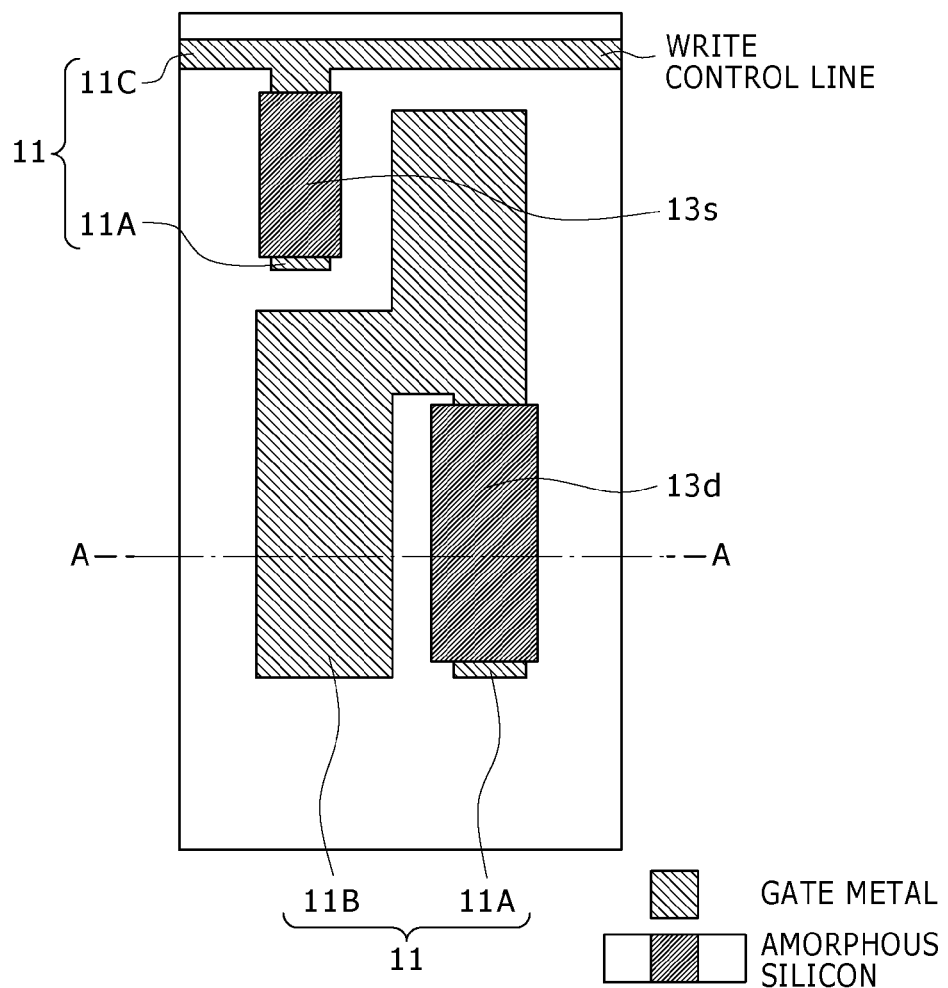
FIGS. 6A and 6B are respectively a top plan view showing a pattern in a phase of laser beam anneal in the pixel circuit shown in FIG. 5A, and a cross sectional view taken on line A-A of FIG. 6A.
Figure 6B:
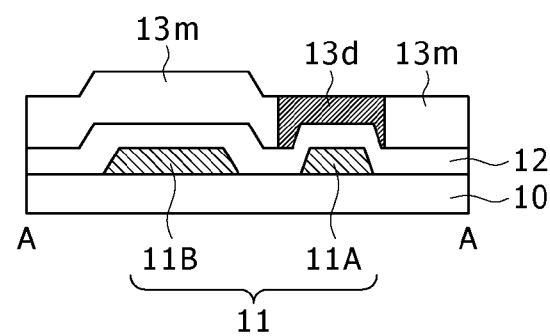

FIG. 6A is a top planar view of a pattern in a phase of the laser beam anneal, and FIG. 6B is a cross sectional view taken on line A-A of FIG. 6A.

This state is a state in which the amorphous silicon film (semiconductor thin film) is deposited over the entire surface shown in FIG. 6A, and as shown in FIG. 6B, a circumference of a portion becoming the thin film semiconductor layer 13d continues with a portion 13m made of the same material as that of the portion becoming the thin film semiconductor layer 13d. The portion 13m is removed by carrying out the patterning after completion of the laser beam anneal, and the thin film semiconductor layer 13d and the thin film semiconductor layer 13s are left so as to have rectangular shapes, respectively.

As has been described, the laser beam anneal is carried out for the TFT within the pixel circuit in the embodiment in the state in which the gate electrode portion (the gate finger portion 11A), after completion of the patterning, which overlap the portions becoming the thin film semiconductor layers 13d and 13s of the amorphous silicon film (semiconductor thin film) through the gate insulating film 12 is formed. Since the process at this time precedes an Al vacuum evaporation process, no Al (of which the VDD line 14A to the connection wiring 14E are made) exists.

Next, let us consider a direction of the scanning for the laser beam anneal.

In the embodiment, as shown in FIG. 7, the scanning for the laser beam anneal is carried out for the display portion 2 having (N×M) pixels while a direction (indicated by an arrow in the figure) is alternately changed over to an opposite direction every one pixel line in the horizontal direction. The reason for this is because when as shown in FIG. 8, the laser beam anneal is carried out in the same direction, a return time (a time required for the homeward route) after the laser anneal is carried out in the outward route becomes useless, and thus the total processing time is prolonged. From this reason, the laser beam anneal processing is executed in the homeward route as well.

When the laser beam anneal scanning shown in FIG. 7 is assumed, in FIG. 6, firstly, the part 11B of the gate electrode 11 is radiated with the laser beam in the outward route to be heated (preliminary heating). After that, the gate finger portion 11A and the thin film semiconductor layer 13d are exposed to the laser beam somewhat late to be heated (main heating).

Although the thin film semiconductor layer 13d directly receives the laser beam in the phase of the main heating to be heated, the thin film semiconductor layer 13d cannot be sufficiently heated with the quick heating or with the low radiation energy density because amorphous silicon as the material of the thin film semiconductor layer 13d has a relatively large heat capacity. On the other hand, when the thin film semiconductor layer 13d is sufficiently heated by the strong laser beam, the sufficient drive characteristics of the TFT cannot be obtained because the mobility p becomes low.

Therefore, when the gate finger portion 11A made of a material which has a smaller heat capacity, that is, a temperature for which rises with a less amount of heat is warmed in the phase of the main heating by the laser beam, the thin film semiconductor layer 13d is subsidiarily heated with this heat.

In addition, when in the preliminary heating carried out prior to the main heating, the part 11B of the gate electrode 11 is warmed, this heat is transmitted from the part 11B of the gate electrode 11 having the high heat conductivity to the gate finger portion 11A. As a result, the temperature of the gate finger portion 11A rises to a certain extent by this preliminary heating. A peak temperature and a duration of the laser beam anneal are important from a viewpoint of enhancement of the anneal effect. In this case, when the preliminary heating is carried out, a time period required to reach the peak temperature can be saved in the main heating. As a result, the duration of the peak temperature also becomes long (the anneal effect becomes large). From this sense, the gate electrode 11 is referred to as "the preliminary heating layer."

From the above, in the outward route of the laser beam anneal scanning, the sufficient anneal effect is obtained for a short time period.

On the other hand, in the homeward route of the laser beam anneal scanning, no preliminary heating is carried out because the gate finger portion 11A and the thin film semiconductor layer 13d are firstly exposed to the laser beam. Therefore, the anneal effect is smaller in the homeward route of the laser beam anneal scanning than in the outward route of the laser beam anneal scanning, which causes the TFT characteristics to alternately dispose every pixel line.

Although the laser beam scanning speed or the illuminance can also be changed between the outward route and the homeward route, when the radiation condition compensates for that the heating state in the outward route is not the same as that in the homeward route, an operation of a laser beam radiating device is not stabilized, and in addition thereto, it is difficult to perfectly remove the dispersion. Also, it is necessary to wait for the stabilization of the laser beam radiating device. As a result, the effect that the processing time period is shortened is degraded in terms of the outward and homeward laser beam radiation.

Figure 9A:
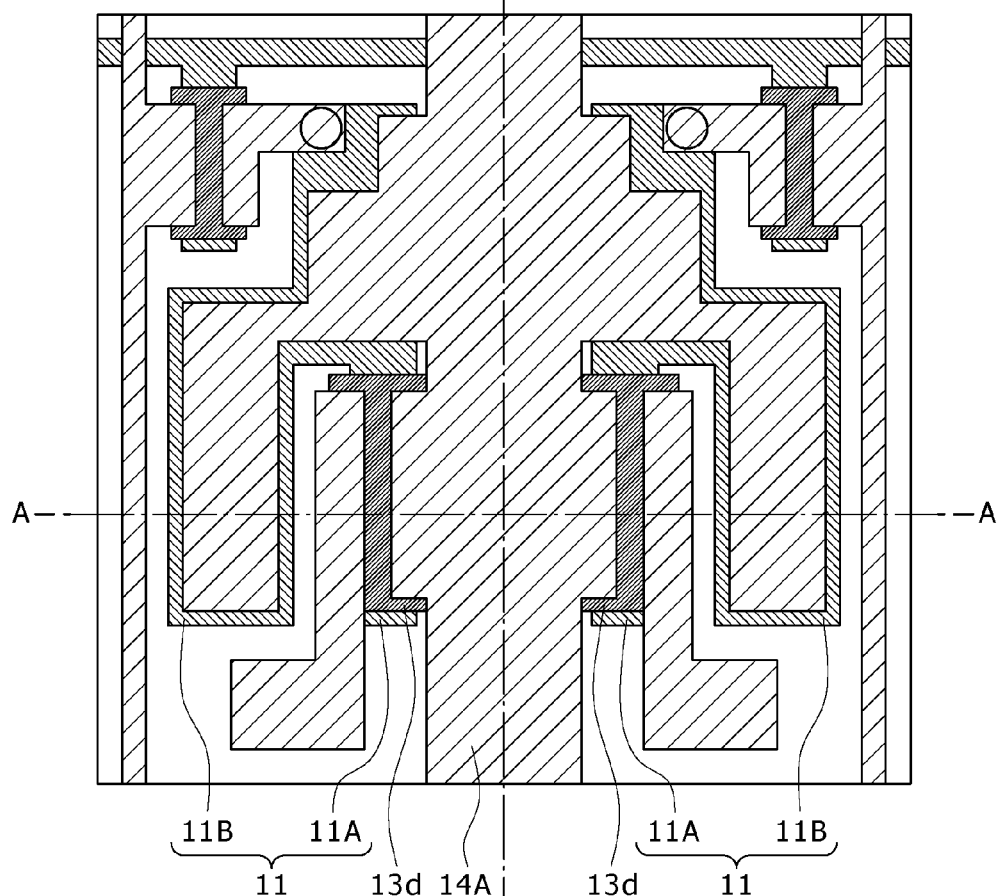
FIGS. 9A and 9B are respectively a top plan view for two pixels when the structures of the pixel circuits each shown in FIG. 5A are disposed so as to show a mirror-symmetry property, and a cross sectional view taken on line A-A of FIG. 9A.
Figure 9B:
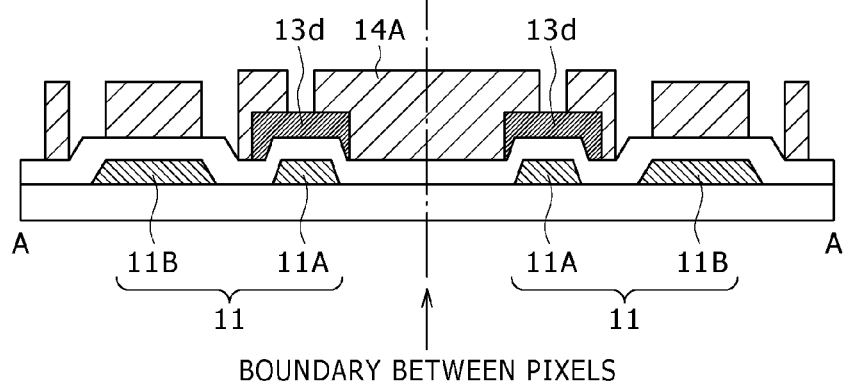

The pixel circuit adopts a mirror disposition for two pixels as shown in FIG. 9 in some cases.

FIG. 9 shows two pixel circuits adjacent to each other through a boundary indicated by a chain line. For the two pixel circuits, a relationship between the gate finger portions 11A, and the parts 11B of the gate electrodes 11 is regulated in such a way that in order that the two pixel circuits may share the VDD line 14A to save the dispersion space thereof, the gate finger portions 11A, and the parts 11B of the gate electrodes 11 are each mirror-symmetrical with respect to the pixel boundary.

Therefore, when the laser beam anneal scanning is carried out from a left-hand side to a right-hand side in the outward route in the pixel portion in which the pattern shown in FIG. 9 is repetitively disposed, the preliminary heating by the part 11B of the gate electrode 11 is carried out in the left-hand side pixel circuit which is firstly annealed. However, no preliminary heating is carried out in the right-hand side pixel circuit which is secondly annealed.

For this reason, the anneal effect is different between the adjacent two pixels, and as a result, the TFT characteristics disperse. This also applies to any of other pixel pairs. Thus, the pixels which are subjected to the preliminary heating are inverted between the outward route and the homeward route, and thus the check-like display nonuniformity occurs in terms of the entire pixel portion.

<Outline of Gate Electrode Pattern>

FIGS. 10A to 10D show some rough types of pattern layouts for preventing the display nonuniformity in this embodiment. In this case, the laser beam anneal scanning is repetitively carried out every pixel line in the outward route and the homeward route in directions shown in these figures in a transverse direction (in an X-axis direction).

Figure 10A:
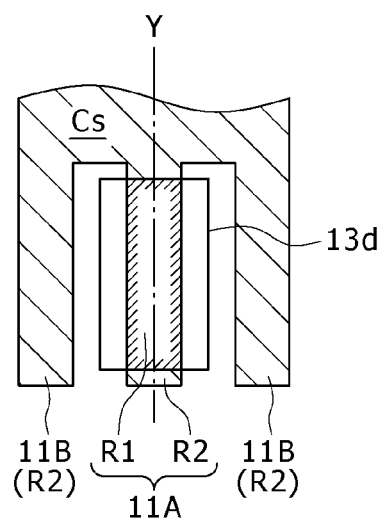
FIGS. 10A to 10D are respectively top plan views showing types of a gate pattern in the organic EL display device of the embodiment shown in FIG. 1.

The layout shown in FIG. 10A is obtained by modifying the layout shown in FIG. 6A. In the layout shown in FIG. 6A, the part (hereinafter referred to as "the preliminary heating portion") 11B of the gate electrode 11 is disposed on one side of the gate finger 11A. On the other hand, in the layout shown in FIG. 10A, the preliminary heating portions 11B having the same size are disposed on both sides of the gate finger portion 11A so as to be symmetrical with respect to a Y-axis. Here, a portion of the gate finger portion 11A overlapping the thin film semiconductor layer 13d is defined as "a first region R1," and a portion of the gate finger portion 11A other than the first region R1 is defined as "a second region R2." Then, it is understood that the second region R2 is symmetrical with a center line of the first region R1 as a boundary.

Figure 10B:
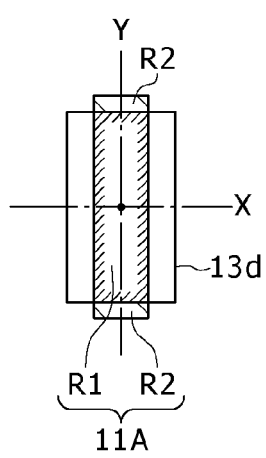

In the layout shown in FIG. 10B, the gate finger portion 11A becomes an isolated pattern on the assumption that the gate finger portion 11A is connected to corresponding portion through a contact (not shown). In this case, no preliminary heating portion 11B is provided, and thus it is understood that the two second regions R2 are symmetrical with two center lines (an X-axis and a Y-axis) of the first region R1 as boundaries. When the two second regions R2 have the same size, "180°-rotational symmetry" is obtained such that when the rotational transfer is carried out about a center point O by 180°, both the patterns just overlap each other.

Figure 10C:
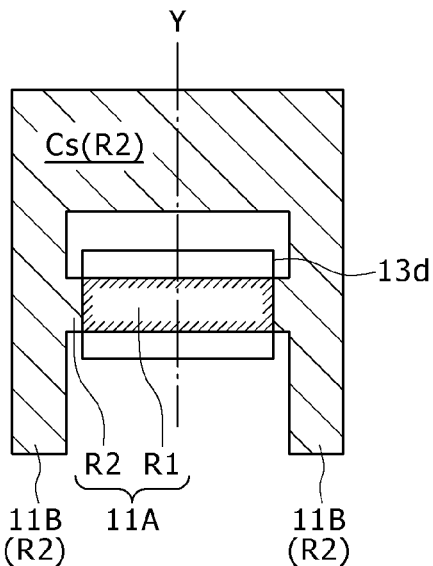
Figure 10D:
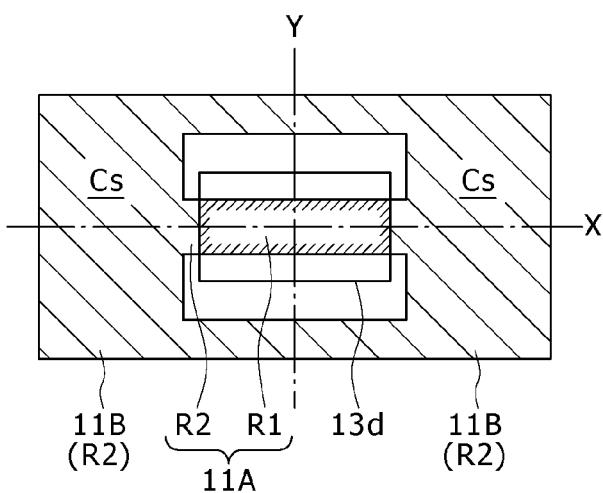

Each of the layouts shown in FIGS. 10C and 10D, respectively, is obtained by changing a longitudinal direction of the gate 11 of FIG. 10A by 90°.

In the layout shown in FIG. 10C, the two second regions R2 located on both sides of the gate finger portion 11A, respectively, the second region R2 becoming the two preliminary heating portions 11B, and the second region R2 becoming the lower electrode of the storage capacitor Cs are all symmetrical with respect to the Y-axis.

In the layout shown in FIG. 10D, a main portion of the lower electrode of the storage capacitor Cs is divided into two parts. In this case, however, the Y-axis symmetry and the X-axis symmetry are simultaneously attained with respect to the second region R2.

Although each of the layouts shown in FIGS. 10A to 10D, respectively, corresponds to the case where the single first region R1 is provided, a plurality of first regions R1 may exist in one thin film transistor.

Figure 11:
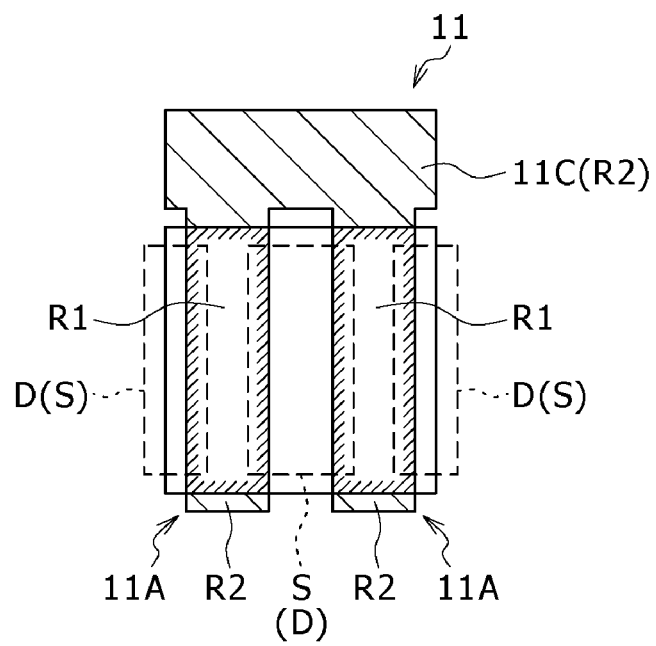
FIG. 11 is a top plan view showing a gate pattern having a plurality of first regions in the organic EL display device of the embodiment shown in FIG. 1.

FIG. 11 shows the simplest layout when one thin film transistor has a plurality of first regions R1.

In the layout illustrated in FIG. 11, the two gate finger portions (the gate electrodes 11A) are formed in parallel with each other to overlap the thin film semiconductor layer 13d. For this reason, the two first regions R1 also have rectangular shapes which are parallel with each other. The two gate electrodes 11A are connected to each other through a connection portion 11C. The gate electrode 11 in such a layout is referred to as "a so-called comb type gate." It is noted that the source electrode and the drain electrode, for example, as indicated by reference symbols "S(source)" and "D(drain)" in FIG. 11, respectively, are mirror-symmetrical with respect to the Y-axis for the two gate electrodes 11A. In addition, the second region R2 as the region other than the first region R1 of the gate electrode 11 also has a pattern which is line-symmetrical with respect to the Y-axis perpendicularly intersecting the scanning direction. However, in this case, there is absent the portion of the second region R2 on which the laser beam impinges earlier than on the first region R1 in the scanning, that is, the preliminary heating portion 11B as shown in FIG. 10A, 10B or 10D. In this sense, the gate electrode 11 shown in FIG. 11 has the pattern in which the preliminary heating portion 11B is absent in both the outward route and the homeward route similarly to the case shown in FIG. 10B.

Figure 12:
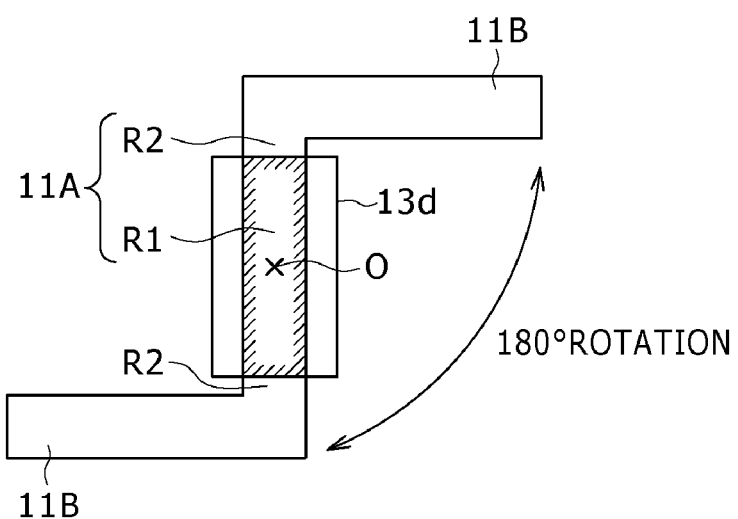
FIG. 12 is a top plan view showing another type of the gate pattern in the organic EL display device of the embodiment shown in FIG. 1.

FIG. 12 shows another type of the 180°-rotational symmetry.

In this type, the gate electrode 11 has an isolated pattern having an S-like shape as a whole. In this case, the isolated pattern of the gate electrode 11 may have an impeller-like shape in which a plurality of S-like patterns are provided around a central axis to overlap one another so as to make an angle between each two S-like patterns.

Hereinafter, Examples 1 and 2 of the embodiment will be described with reference to top plan views and cross sectional views of concrete pixel circuits by taking up the layouts shown in FIGS. 10A and 10B as a representative of the layouts shown in FIGS. 10A to 10D and FIGS. 11 and 12. It should be noted that any other layout can be similarly applied to the pixel circuit. In the following description, the same constituent portions as those shown in FIGS. 5A and 5B, and FIGS. 6A and 6B are designated with the same reference numerals or symbols, respectively, and a description thereof is omitted here for the sake of simplicity, and only different portions in patterns are mentioned.

EXAMPLE 1

Figure 13A:
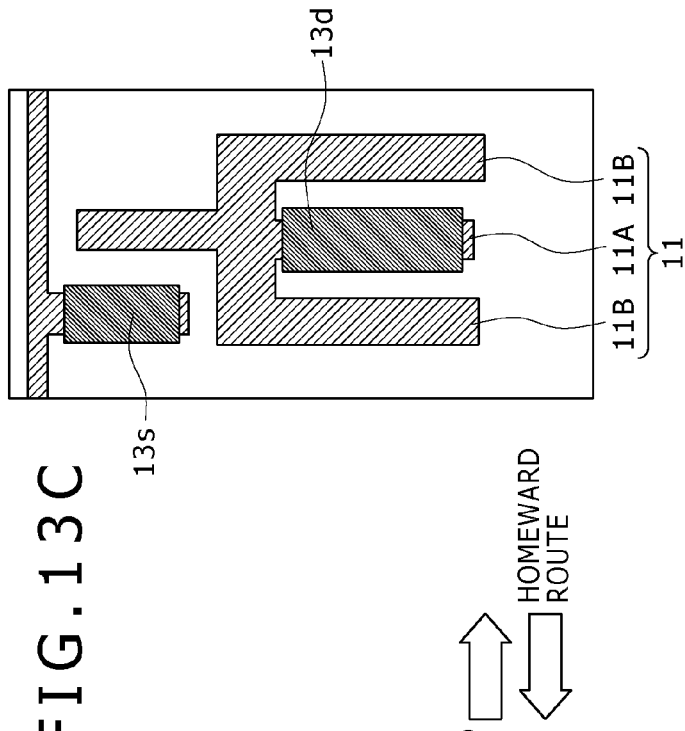
FIGS. 13A, 13B and 13C are respectively a top plan view of a pixel circuit in Example 1, a cross sectional view taken on line A-A of FIG. 13A, and a top plan view of the pixel circuit in Example 1 in a phase of laser beam anneal.
Figure 13B:
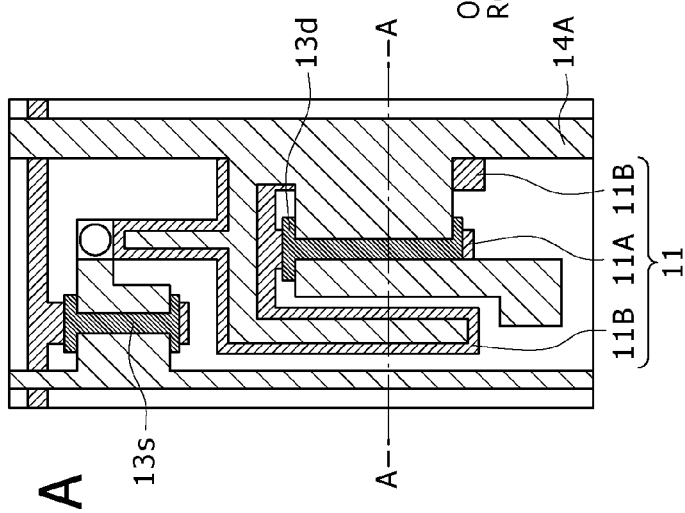
Figure 13C:
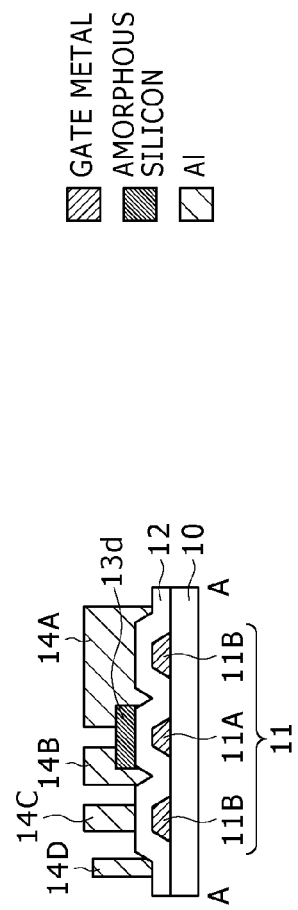

FIG. 13A shows a top plan view of a pixel circuit in Example 1, FIG. 13B shows a cross sectional view taken on line A-A of FIG. 13A, and FIG. 13C shows a top plan view of the pixel circuit in Example 1 in a phase of the laser beam anneal scanning. FIGS. 13A, 13B and 13C correspond to FIGS. 5A, 5B and FIG. 6A, respectively.

Two preliminary heating portions 11B are symmetrically provided on the both sides of the gate finger portion 11A, respectively, in the laser beam anneal scanning directions indicated by arrows of the outward route and the homeward route, respectively. Therefore, since the anneal effect for the thin film semiconductor layer 13d does not change between the outward route and the homeward route, the dispersion of the TFT characteristics at least due to the outward route and the homeward route is not caused. In addition, since a structure is adopted such that the preliminary heating and the subsidiary heating are carried out with the gate electrode 11 by using the thin film semiconductor layer 13d made of amorphous silicon, the mobility p can be increased several times as large as that in the laser beam anneal by which amorphous silicon is directly heated.

Note that, the thin film semiconductor layer 13s overlaps the gate electrode 11 which is symmetrical from the beginning. However, when the gate electrode 11 is asymmetrical from the beginning, it is better to give the gate electrode 11 the symmetry property of the gate electrode portion like the preliminary heating portion 11B for the thin film semiconductor layer 13d. The reason for this is because although being not quite the case of the drive transistor Md, it is desirable to suppress the characteristic dispersion with respect to the sampling transistor Ms as well.

The size of the laser radiation region used herein is determined so as to be shorter than a height (a size in the Y-axis direction) of one pixel, and so as to allow the thin film semiconductor layer 13d and the thin film semiconductor layer 13s to be simultaneously annealed.

EXAMPLE 2

FIG. 14A shows a top plan view of a pixel circuit in Example 2, and FIG. 14B shows a top plan view of the pixel circuit in Example 2 in a phase of the laser beam anneal scanning. FIGS. 14A and 14B correspond to FIG. 5A and FIG. 6A, respectively.

No preliminary heating portion is provided on the both sides of the gate finger portion 11A in the laser beam anneal scanning direction indicated by the arrows of the outward route and the homeward route. More specifically, although the gate finger portion 11A is made of the same material as that of the lower electrode 11C of the storage capacitor Cs, the gate finger portion 11A is formed in the form of an isolated pattern which is independent of mutual connection between the gate finger portion 11A and the lower electrode 11C. The lower electrode 11C of the storage capacitor Cs is connected to the VDD line 14A through a contact CH2. In addition, the second region R2 having a large area is formed in one end portion of the gate finger portion 11A, and is connected to an upper electrode (made from an Al layer) 14F of the storage capacitor Cs through a contact CH1.

Therefore, since the anneal effect for the thin film semiconductor layer 13d does not change between the outward route and the homeward route, the dispersion of the TFT characteristics at least due to the outward route and the homeward route is not caused. In addition, since a structure is adopted such that the preliminary heating and the subsidiary heating are carried out with the gate electrode 11 by using the thin film semiconductor layer 13d made of amorphous silicon, the mobility $\mu$ can be increased several times as large as that in the laser beam anneal scanning by which amorphous silicon is directly heated.

It is noted that the fact that the gate electrode 11 overlapping the thin film semiconductor layer 13s can be given the symmetry property, the laser radiation region, and the laser light source are the same as those in Example 1.

Although the embodiment described above has been described based on the case where the thin film semiconductor layer is made of amorphous silicon, the present invention can also be applied to the case where amorphous silicon is made to turn into polycrystalline silicon (polysilicon) by carrying out the anneal. In the case of such a polysilicon TFT, it is necessary to increase the energy density of the laser beam radiation. In the embodiment, however, the anneal with the lower energy density can be carried out because the subsidiary heating using the gate electrode can be carried out, and the uniformity of the heating using the pattern is enhanced when the preliminary heating is carried out. However, since the TFT characteristics of the polysilicon TFT essentially hardly disperse due to the anneal, the effect of suppressing the dispersion of the TFT characteristics is not so large as amorphous silicon.

In addition, although the description has been given based on the back gate structure in which the thin film semiconductor layer 13d or the like is stacked above the gate electrode 11, a structure may also be adopted such that the gate electrode 11 is stacked on the thin film semiconductor layer 13d or the like through the gate insulating film 12. In this case, the laser beam anneal needs to be carried out in a state in which the pattern of the gate electrode 11 is formed.

According to the embodiment described above, the following advantages can be obtained.

The gate metals each set at the same potential as that of the gate electrode of the drive transistor in the phase of the laser beam anneal are disposed on the both sides of the drive transistor with respect to the scanning direction of the laser beam, or none of them is disposed in such a manner at all. Thus, the gate electrode pattern having the two regions which are axially symmetrical or rotationally symmetrical is formed, which results in that the uniform characteristics can be obtained irrespective of the direction of the laser beam anneal scanning.

The uniform characteristics can be obtained irrespective of the direction of the laser beam anneal scanning, which results in that it is unnecessary to adjust the strength of the anneal in accordance with the scanning direction of the laser beam anneal, and thus it is possible to realize the reduction of the tact time.

In addition, it is possible to reduce the streak-like dispersion of the threshold voltages and mobilities of the drive transistors, and thus it is possible to obtain the uniform image quality free from the nonuniformity.

Note that, when as shown in Examples 1 and 2, the second region R2 of the gate electrode 11 is symmetrical with respect to the Y-axis, there is also an advantage that the VDD line 14A can be shared between the two pixels adjacent to each other in the Y direction, thereby making it possible to save the disposition space of the VDD line 14A.

The present application contains subject matter related to that disclosed in Japanese Priority Patent Application JP 2008-182889 filed in the Japan Patent Office on Jul. 14, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An electronic device, comprising:
a substrate; and
a plurality of thin film transistors disposed in lines at least in one direction in terms of planar view when viewed from one principal surface of said substrate, each of said plurality of thin film transistors including (a) a preliminary heating layer on said substrate, (b) an insulating layer on said preliminary heating layer, and (c) a thin film semiconductor layer, a part of which overlaps said preliminary heating layer through said insulating film, wherein,
a portion of said preliminary heating layer other than the portion overlapping said thin film semiconductor layer has a planar shape which is line-symmetrical with respect to an axis extending in a direction perpendicularly intersecting the one direction,
said preliminary heating layer has a first region overlapping said thin film semiconductor layer, and a second region other than said first region, and
said second region has a planar shape having a line-symmetrical axis passing through a center of said first region.

2. An electronic device, comprising:
a substrate; and
a plurality of thin film transistors disposed in lines at least in one direction in terms of planar view when viewed from one principal surface of said substrate, each of said plurality of thin film transistors including (a) a preliminary heating layer on said substrate, (b) an insulating layer on said preliminary heating layer, and (c) a thin film semiconductor layer, a part of which overlaps said preliminary heating layer through said insulating film, wherein,
a portion of said preliminary heating layer other than the portion overlapping said thin film semiconductor layer has a planar shape which is line-symmetrical with respect to an axis extending in a direction perpendicularly intersecting the one direction,
said preliminary heating layer has a plurality of first regions each overlapping said thin film semiconductor layer, and a second region other than said plurality of first regions,
each of said plurality of first regions has a rectangular planar shape having long sides parallel with each other, and
said second region has a planar shape having a line-symmetrical axis parallel with each of said long sides of each of said plurality of first regions.

3. The electronic device according to claim 1, wherein, for each transistor, said preliminary heating layer is a gate electrode of said thin film transistor, and said insulating film is a gate insulating film of said thin film transistor.

4. The electronic device according to claim 3, wherein, for each transistor, a gate electrode of said thin film transistor is bottom gate electrode.

5. The electronic device according to claim 1, wherein,
said thin film semiconductor layer is made of amorphous silicon, and
said preliminary heating layer is made of a conductive material which is smaller in heat capacity than each of said thin film semiconductor layer and said insulating film, and is higher in heat conductivity than each of said thin film semiconductor layer and said insulating film.

6. The electronic device according to claim 1, wherein:
a plurality of pixels, each including a light emitting element light emission of which is driven in accordance with an amount of current caused to flow through said light emitting element, and a drive transistor provided in a drive current path of said light emitting element, are disposed in a matrix in terms of planar view when viewed from one principal surface of said substrate, and
for each pixel, said drive transistor is the thin film transistor.

7. An electronic device, comprising:
a substrate; and
a plurality of thin film transistors disposed in lines at least in one direction in terms of planar view when viewed from one principal surface of said substrate, each of said plurality of thin film transistors including (a) a preliminary heating layer on said substrate, (b) an insulating layer on said preliminary heating layer, and cc) a thin film semiconductor layer, a part of which overlaps said preliminary heating layer through said insulating film, wherein,
a planar shape of said preliminary heating layer when viewed from the one principal surface has at least one first region overlapping said thin film semiconductor layer, and a second region other than said first region, and
a planar shape of said second region has two rotationally symmetrical portions in which when one rotationally symmetrical portion rotates about a rotationally symmetrical axis as a center by 180°, said one rotationally symmetrical portion overlaps said other rotationally symmetrical portion.

8. A method of manufacturing an electronic device, comprising the step of forming a plurality of thin film transistors disposed in lines at least in one direction in terms of planar view when viewed from one principal surface of a substrate on said substrate, the step of forming said plurality of thin film transistors including the steps of forming a preliminary heating film on said substrate, patterning said preliminary heating film into a predetermined planar shape for each thin film transistor, forming an insulating film so as to cover exposed surfaces of said plurality of preliminary heating layers, forming a semiconductor thin film on said insulating film, scanning a laser beam from one side to the other side of the one direction, repeating the scanning plural times while a direction of the scanning is alternately changed within the one direction, and annealing said semiconductor thin film, and patterning said semiconductor thin film in order to form said thin film semiconductor layer for each thin film transistor, wherein
   in the step of patterning said preliminary heating film, said preliminary heating film is patterned so that the predetermined planar shape of said preliminary heating film for each thin film transistor becomes line-symmetrical with respect to an axis extending in a direction perpendicularly intersecting the one direction, and
   in the step of patterning said semiconductor thin film, said semiconductor thin film is patterned so as to form said thin film semiconductor layers in which a planar shape of a region other than a region partially overlapping said preliminary heating layer becomes line-symmetrical with respect to said axis.

\* \* \* \* \*